(12) United States Patent
Cypher

(10) Patent No.: US 7,412,642 B2
(45) Date of Patent: Aug. 12, 2008

(54) SYSTEM AND METHOD FOR TOLERATING COMMUNICATION LANE FAILURES

(75) Inventor: Robert E. Cypher, Saratoga, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 509 days.

(21) Appl. No.: 11/075,478

(22) Filed: Mar. 9, 2005

(65) Prior Publication Data

US 2006/0212775 A1 Sep. 21, 2006

(51) Int. Cl.
*H03M 13/00* (2006.01)
(52) U.S. Cl. ...................................... 714/776; 714/758
(58) Field of Classification Search ................. 714/758, 714/776
See application file for complete search history.

(56) References Cited

U.S. PATENT DOCUMENTS

| | | | | |
|---|---|---|---|---|
| 4,491,943 A | * | 1/1985 | Iga et al. ..................... | 370/511 |
| 5,844,918 A | * | 12/1998 | Kato .......................... | 714/751 |
| 6,473,880 B1 | | 10/2002 | Cypher | |
| 6,836,469 B1 | * | 12/2004 | Wu ............................. | 370/322 |
| 6,973,613 B2 | | 12/2005 | Cypher | |
| 6,976,194 B2 | | 12/2005 | Cypher | |
| 2004/0003339 A1 | | 1/2004 | Cypher | |

FOREIGN PATENT DOCUMENTS

EP         1 274 207         1/2003

OTHER PUBLICATIONS

Notification of Transmittal of the International Search Report and The Written Opinion of the International Searching Authority or the Declaration, PCT/US2006/008791, Jul. 4, 2006.
International Search Report, PCT/US2006/008791, Jul. 4, 2006.
Written Opinion of the International Searching Authority, PCT/US2006/008791, Jul. 4, 2006.
Optical Internetworking Forum, "Very Short Reach (VSR) OC-192/STM-64 Interface Based on Parallel Optics," Dec. 18, 2000, pp. 1-14, http://www.oiforum.com/public/document.

* cited by examiner

*Primary Examiner*—Jacques Louis-Jacques
*Assistant Examiner*—M. Mujtaba K Chaudry
(74) *Attorney, Agent, or Firm*—Meyertons Hood Kivlin Kower & Goetzel, P.C.; Stephen J. Curran

(57) ABSTRACT

A system for tolerating communication lane failures includes a transmitter configured to transmit a segment of data, an error detecting code, and redundant information. The system also includes a receiver coupled to the transmitter via a communication link including a plurality of bit lanes. Each bit of the segment of data may be conveyed to the receiver serially via respective single-bit lanes. The segment of data, the redundant information, and the error detecting code may be accumulated within the receiver over a plurality of clock cycles. The receiver may detect an error in the segment of data using the error detecting code. In addition, the receiver may, in response to detecting the error, regenerate the segment of data using the redundant information. Further, the receiver may determine whether a resulting regenerated bit, along with remaining bits, of the segment of data are correct using the error detecting code.

16 Claims, 4 Drawing Sheets

SYSTEM AND METHOD FOR TOLERATING COMMUNICATION LANE FAILURES

BACKGROUND OF THE INVENTION

1. Field of the Invention

This invention relates generally to computer systems and, more particularly, to error detection and correction in communications between two circuits.

2. Description of the Related Art

There are many mechanisms for detecting and correcting errors in communications between two devices or circuits. However, some of the conventional communications mechanisms may require elaborate handshaking and/or error correction algorithms. For example, some systems that employ multiple parallel communication lanes to convey information between two circuits may communicate error detection/correction information back to the sending device upon detection of an error. In doing so, such systems may rely on some form of transmitter/receiver agreement that a given communication lane has failed. However, for some systems, this type of complex handshaking and/or error correction may be undesirable.

SUMMARY

Various embodiments of a system for tolerating communication lane failures are disclosed. In one embodiment, the system includes a transmitter coupled to a receiver via a communication link including a plurality of bit lanes. The transmitter may be configured to transmit a segment of data, an error detecting code, and redundant information. Each bit of the segment of data may be conveyed to the receiver serially via a respective single-bit lane. The segment of data, the redundant information, and the error detecting code may be accumulated within the receiver over a plurality of clock cycles. The receiver may detect an error in the segment of data using the error detecting code. In addition, the receiver may, in response to detecting the error, regenerate the segment of data using the redundant information. Further, the receiver may be configured to determine whether a resulting regenerated bit, along with remaining bits, of the segment of data are correct using the error detecting code.

Figure 1:
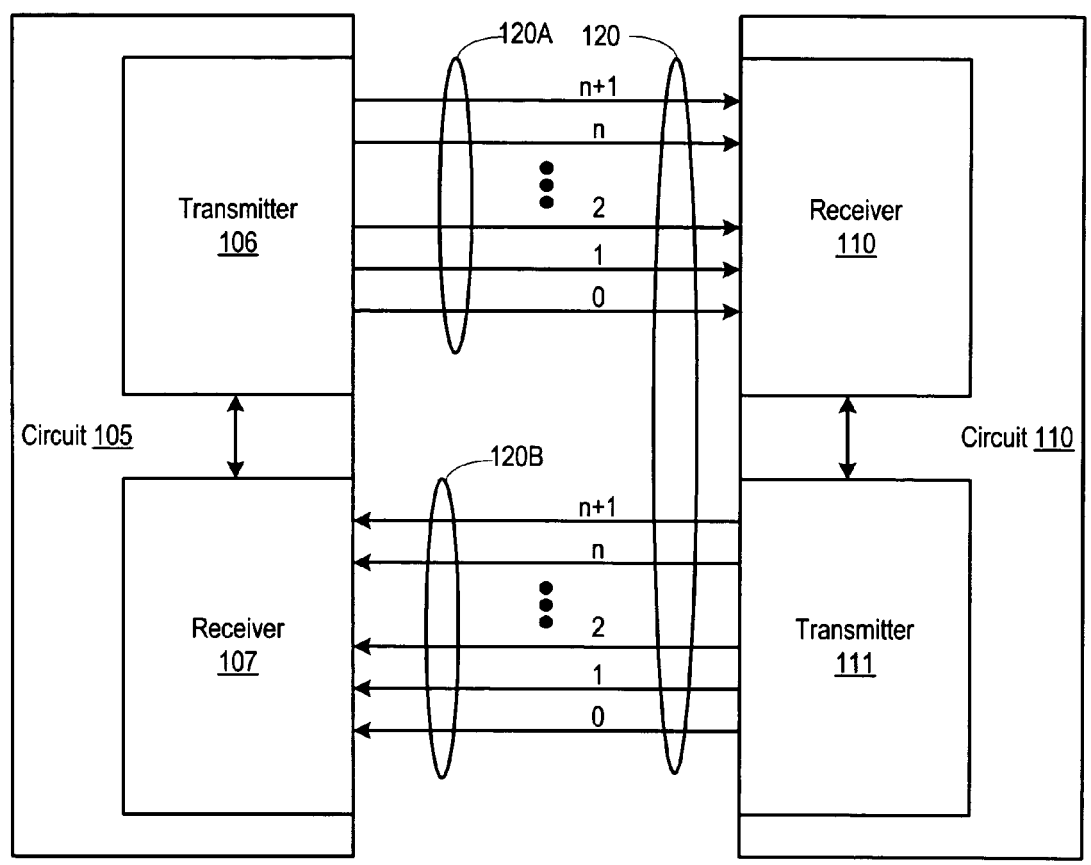
FIG. 1 is a diagram depicting one embodiment of two circuits communicating via a communication link.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims.

Furthermore, note that the word "may" is used throughout this application in a permissive sense (i.e., having the potential to, being able to), not a mandatory sense (i.e., must). The term "include" and derivations thereof mean "including, but not limited to." The term "connected" means "directly or indirectly connected," and the term "coupled" means "directly or indirectly coupled."

DETAILED DESCRIPTION

Turning now to FIG. 1, a diagram depicting one embodiment of two circuits communicating via a bi-directional communication link is shown. Circuit 105 includes a transmitter 106 and a receiver 107. Likewise, circuit 110 also includes a transmitter 111 and a receiver 110. Circuits 105 and 110 are coupled together via a communication link 120. It is noted that circuits 105 and 110 may each be representative of any type of circuit. For example, circuit 105 may be representative of a processor (not shown) while circuit 110 may be representative of an I/O node (not shown) or a memory subsystem (not shown).

In the illustrated embodiment, communication link 120 includes a pair of unidirectional links 120A and 120B coupled to provide bi-directional communication between circuits 105 and 110. More particularly, transmitter 106 is coupled to receiver 110 via unidirectional link 120A and transmitter 111 is coupled to receiver 107 via unidirectional link 120B. Each of unidirectional links 120A and 120B includes a number of communication lanes, designated 0 through n. Each of communication lanes 0-n may be configured to convey a portion of information from a respective transmitter to a respective receiver. In addition, each of unidirectional links 120A and 120B includes a communication lane designated n+1, that is configured to convey redundant information that may be used to reconstruct the information conveyed on the 0-n communication lanes in the event of an error or a failure.

It is noted that communication link 120 may be representative of any type of communication link. For example, in one embodiment, communication link 120 may be compatible with HyperTransport™ technology. It is further noted that each communication lane may be a single-bit lane or a multi-bit lane and may be implemented in a single-ended or a differential signaling configuration. However, it is contemplated that in other embodiments, unidirectional links 120A and 120B may be logical links that share a common physical medium.

In one embodiment, communication lanes 0-n may convey a segment of data, transaction sequence number, an acknowledge (ACK) number, and an error detecting code such as a cyclic redundancy code (CRC), for example, which covers the information conveyed on the remaining lanes of communication lanes 0-n of unidirectional links 120A and 120B. In one embodiment, communication lane n+1 of unidirectional links 120A and 120B may convey parity of the information conveyed on communication lanes 0-n. It is noted that although a CRC is used, other embodiments may use other error detecting codes or error correcting codes. It is noted that in one embodiment, the information conveyed on communication lanes 0-n may include transactions conveyed using a packetized protocol. However, in other embodiments the transactions may be conveyed using other protocols.

As will be described in greater detail below, in one embodiment, receivers 110 and 107 may be configured to receive the information transmitted by transmitter 106 and 111, respectively. Upon receiving the information, receivers 110 and 107 may use the CRC to check the transmitted information for errors. If an error is detected, receivers 110 and 107 may iteratively regenerate the bits of the segment of data transmitted on at least one respective communication lane, using the redundant information. Receivers 110 and 107 may then determine whether the resulting regenerated bits, along with the bits of the segment of data transmitted on remaining communication lanes, are correct using the CRC.

Figure 2C:
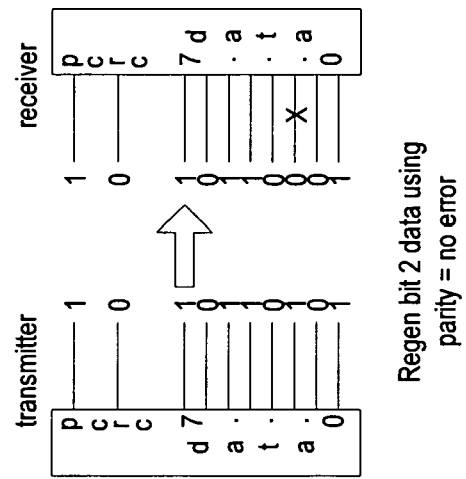
FIG. 2A-FIG. 2C are diagrams illustrating an exemplary process for isolating a failed communication link.
Figure 2B:
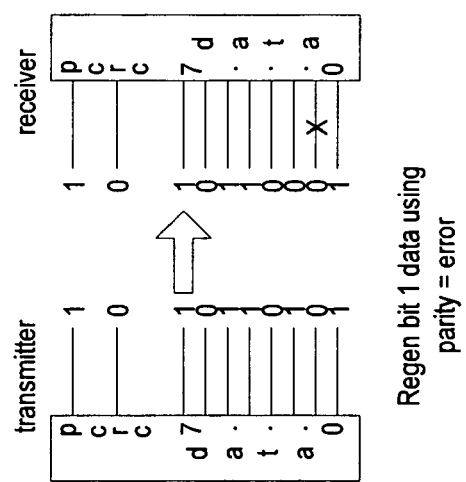
Figure 2A:
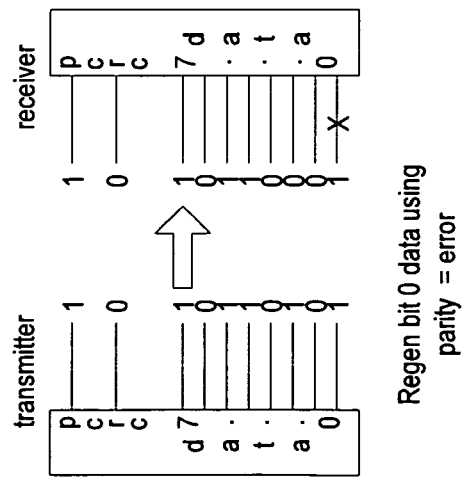

FIG. 2A through FIG. 2C illustrate a communication sequence showing how receivers 110 and 107 may detect and isolate a failed communication lane without using a complex lane failure protocol between a given transmitter and a corresponding receiver. In the embodiments of FIG. 2A-FIG. 2C, a 10-lane link having eight one-bit data lanes, a CRC lane and one redundant lane is shown. In the illustrated embodiment, the data bits, CRC and parity bit may be transmitted via the link in a given clock cycle or "beat." For example, a data segment or block may include 128 bits that may be transmitted over several beats. In such an embodiment, the CRC word may be 16 bits long and it may cover the entire data segment, for example. However, the parity bit may cover the data bits and CRC bit sent during each beat. Thus, in one beat, eight bits of data, a parity bit and one bit of the 16-bit CRC word may be transmitted. Accordingly, it may take 16 beats to transmit and receive the data segment and CRC on a 10-lane link. Thus, as described above, a transmission includes all the data bits that are covered by the CRC word, the CRC word itself and the parity bit sent each beat. It is noted that in one embodiment, the transmission of the 128 data bits may be done over 16 beats such that lane 0 may transmit data bits 0-15, lane 1 may transmit data bits 16-31, lane 2 may transmit data bits 32-47 and so on. It is also noted that in various other embodiments any number of data lanes and any number of corresponding CRC lanes may be used. It is further noted that the parity bit may represent either even or odd parity for each group of data bits and CRC in each beat as desired.

In one embodiment, the CRC word may be able to detect any error within a single lane, whether or not a lane is currently being reconstructed using the parity lane. In addition, the CRC word may be able to detect any error within a single beat, whether or not a lane is currently being reconstructed. The CRC word may be generated and checked either serially or in parallel. To generate a CRC word serially, a linear feedback shift register (LFSR) having a predetermined CRC polynomial may be used. In such an embodiment, the data bits and the CRC bits in each lane may be serially input to the LFSR. For example, the data bits may be input to the LFSR, in order, from the last beat to the first beat per lane, such that all of the bits covered within a given lane being input before any bits from the next lane are input to produce the 16-bit CRC word. Thus, the bit lanes are concatenated and serially fed into the LFSR. When generating the CRC word, the CRC bits may be set to zero and when checking the data at the receiver, the received CRC bits may be input to the LFSR. To generate a CRC word having the above properties, in one implementation, the CRC polynomial for the LFSR may be a degree 16 polynomial such as $x^{16}+x^{15}+x^{11}+x^9+x^8+x^7+x^5+x^4+x^2+x+1$, for example. In embodiments that generate a CRC word in parallel, Excusive-OR (XOR) trees may be used. Table 1 illustrates an exemplary transmission of a 128-bit data block and its corresponding CRC and parity bits over a 10-lane link.

TABLE 1

| | An exemplary 128-bit data block transfer on a 10-lane link | | | | | | | | | |
|---|---|---|---|---|---|---|---|---|---|---|
| Beat | L9 | L8 | L7 | L6 | L5 | L4 | L3 | L2 | L1 | L0 |
| 0 | P0 | C0 | D112 | D96 | D80 | D64 | D48 | D32 | D16 | D0 |
| 1 | P1 | C1 | D113 | D97 | D81 | D65 | D49 | D33 | D17 | D1 |
| 2 | P2 | C2 | D114 | D98 | D82 | D66 | D50 | D34 | D18 | D2 |
| 3 | P3 | 3C | D115 | D99 | D83 | D67 | D51 | D35 | D19 | D3 |
| 4 | P4 | 4C | D116 | D100 | D84 | D68 | D52 | D36 | D20 | D4 |
| 5 | P5 | 5C | D117 | D101 | D85 | D69 | D53 | D37 | D21 | D5 |
| 6 | P6 | 6C | D118 | D102 | D86 | D70 | D54 | D38 | D22 | D6 |
| 7 | P7 | 7C | D119 | D103 | D87 | D71 | D55 | D39 | D23 | D7 |
| 8 | P8 | 8C | D120 | D104 | D88 | D72 | D56 | D40 | D24 | D8 |
| 9 | P9 | C9 | D121 | D105 | D89 | D73 | D57 | D41 | D25 | D9 |
| 10 | P10 | C10 | D122 | D106 | D90 | D74 | D58 | D42 | D26 | D10 |
| 11 | P11 | C11 | D123 | D107 | D91 | D75 | D59 | D43 | D27 | D11 |
| 12 | P12 | C12 | D124 | D108 | D92 | D76 | D60 | D44 | D28 | D12 |
| 13 | P13 | C13 | D125 | D109 | D93 | D77 | D61 | D45 | D29 | D13 |
| 14 | P14 | C14 | D126 | D110 | D94 | D78 | D62 | D46 | D30 | D14 |
| 15 | P15 | C15 | D127 | D111 | D95 | D79 | D63 | D47 | D31 | D15 |

In FIG. 2A, an exemplary transmission from a transmitter to a receiver via a unidirectional link such as link 120A with an error in bit lane two is shown. The information transmitted by the transmitter includes an eight-bit portion of a data segment including the bits 10110101$b$, a CRC bit (assumed to equal zero for simplicity), and a parity bit that is shown as a binary one. However, the information received by the receiver is data portion 10110001$b$, a CRC bit, and a parity bit that is a binary one. Thus, there is an error in bit lane two of the data portion. Assuming there are no other errors, once the data blocks are received, the receiver may detect the error using the received CRC bits. In response to an error detection, the receiver may send a NACK signal to the transmitter for that transmission indicating to the transmitter to resend or retry that transmission.

If the receiver continues to detect an error, the receiver may send the NACK signal for a predetermined number of times in an effort to rule out transient errors. After the predetermined number of retries, if the receiver is still detecting the error, the receiver designates one of the bit lanes as having the error (as denoted by the X on bit lane zero) and then recreates the bit lane zero data using the parity bit and the remaining bit lane data bits and CRC bit. The receiver then checks the recreated data using the CRC bits. If the receiver still detects an error, in one embodiment, the receiver may again send a NACK signal to the transmitter for that transmission. The receiver may request a resend for a predetermined number of times. The receiver may designate bit lane zero as a failed bit lane for each subsequent retry of that transmission.

As shown in FIG. 2B, after the predetermined number of retries with bit lane zero being designated as a failure and the receiver continuing to detect an error, the receiver may designate bit lane one as having failed (as denoted by the X on bit lane one). Similar to the operation described in conjunction with FIG. 2A, the receiver may recreate the data in bit lane one using the parity bit and the remaining bit lane data bits and CRC bit. The receiver then checks the recreated data using the CRC bits. If the receiver still detects an error, in one embodiment, the receiver may send a NACK signal to the transmitter for that transmission. The receiver may request a retry for a predetermined number of times. The receiver may designate bit lane one as a failed bit lane for each subsequent retry of that transmission.

As shown in FIG. 2C, after the predetermined number of retries with bit lane one being designated as a failure and the receiver continuing to detect an error, the receiver may designate bit lane two as having failed (as denoted by the X on bit lane two). Similar to the operation described in conjunction with FIG. 2A and FIG. 2B, the receiver may recreate the data in bit lane two using the parity bit and the remaining bit lane data bits and CRC bits. The receiver checks the recreated data using the CRC bits. If the receiver were to still detect an error, in one embodiment, the receiver may send a NACK signal to the transmitter for that transmission. However in this example, bit lane two is the failing bit lane. Accordingly, the error check using the CRC bits should indicate that there are no errors. Thus, the receiver may designate bit lane two as a failed bit lane for all subsequent transmissions, thereby isolating the failing bit lane.

In one embodiment, in response to successfully isolating the failing bit lane, the receiver may be configured to notify service personnel of the faulty lane. The operation of the receiver is described in more detail below in conjunction with the description of FIG. 3.

Figure 3:
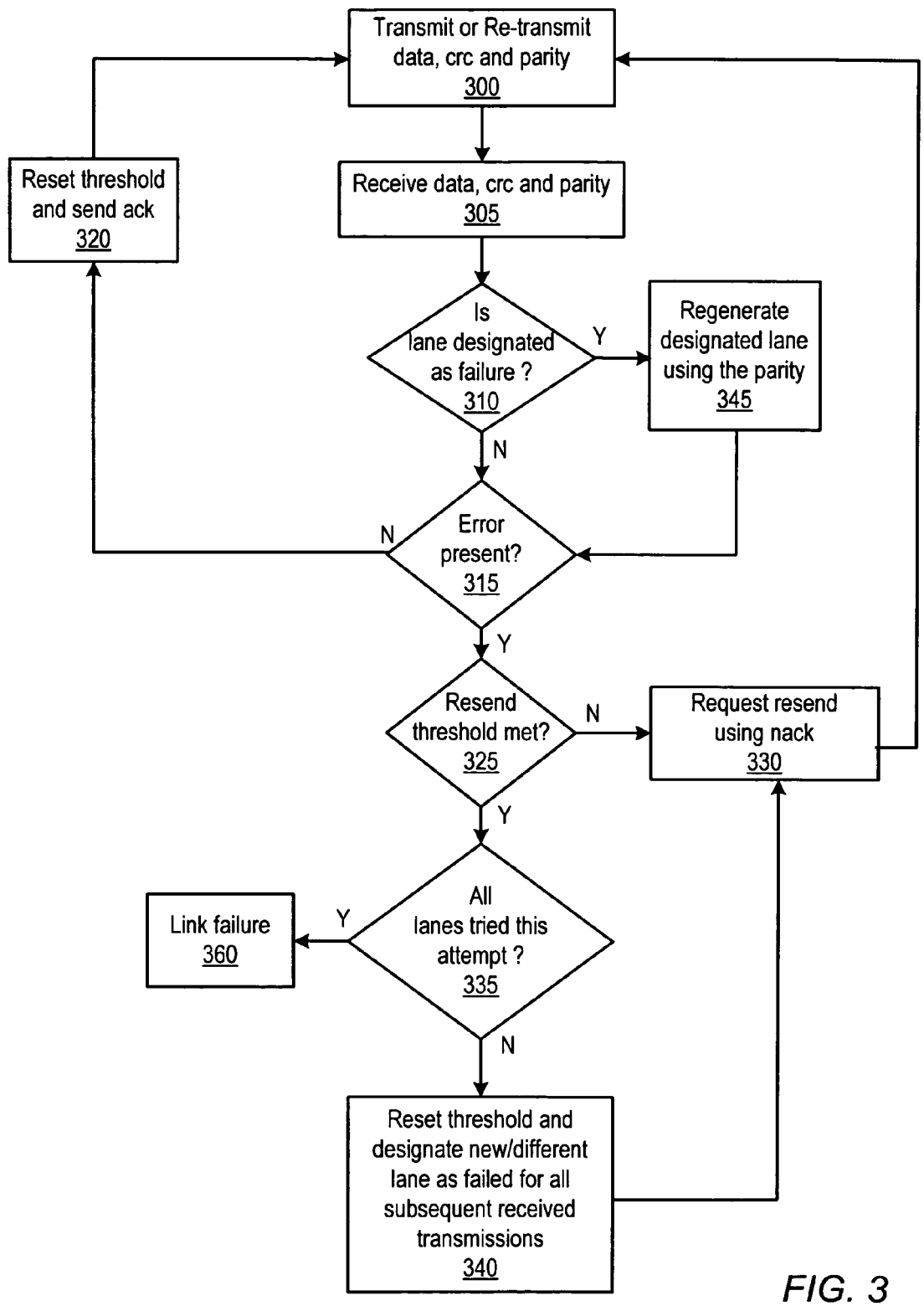
FIG. 3 is a flow diagram describing the operation of one embodiment of an exemplary receiver of the circuits of FIG. 1.

In FIG. 3, a flow diagram describing the operation of one embodiment of a receiver of FIG. 1 and FIG. 2 is shown. Referring collectively to FIG. 1-FIG. 3, a transmitter such as transmitter 106 transmits data, CRC and parity over a communication link such as unidirectional link 120A, for example (block 300). Receiver 110 receives the data, CRC and parity (block 305). In one embodiment, receiver 110 may be configured to check whether a communication bit lane has already been designated as a failing bit lane (block 310). Assuming that no bit lanes have been designated as failing, receiver 110 may check for any errors in the transmission using the CRC bits (block 315). If there are no errors detected, receiver 110 may send an ACK signal to transmitter 106, thereby indicating that the transmission has been received (block 320).

Referring back to block 315, if an error is detected, receiver 110 may check whether a resend threshold has been met (block 325). For example, to eliminate transient errors as the source of the error, receiver 110 may request a retry or resend from transmitter 106 for some predetermined number of times, after which a continuing error may be considered a hard failure. In one implementation, the resend threshold may be a value stored within a programmable register (not shown), for example. If the resend threshold has not been met, receiver 110 may send a NACK signal to transmitter 106, indicating that the transmission has not been received and to resend that transmission (block 330). In one embodiment, the NACK signal may include an identifier such as a transmission sequence number, for example, that indicates which transmission is to be resent.

Operation proceeds back to block 300 where transmitter 106 resends the transmission. Assuming that the error is still present, this resend, error check and error detect sequence may continue until either the error disappears or the resend threshold is met (block 325). Once the resend threshold is met, receiver 110 determines whether all bit lanes have been designated as failures during this transmission attempt (block 335). If all bit lanes have not been designated as a failure during this transmission, the resend threshold is reset and receiver 110 designates one of the bit lanes as a failure for all subsequent received transmissions (block 340).

Operation proceeds as above in block 330 where receiver 110 may send a NACK signal to transmitter 106, indicating that the transmission has not been received and to resend that transmission (block 330). Receiver 110 checks whether a communication bit lane has been designated as a failing bit lane (block 310). Since it has, receiver 110 recreates the data of the designated bit lane using the parity information (block 345) and then checks whether an error is present using the CRC bits (block 315).

If there is no error (block 315), the failing bit lane has been identified. Receiver 110 has designated that bit lane as a failed lane for all subsequent received transmissions, thus the failed bit lane is now isolated. Receiver 110 resets the threshold count and sends an ACK signal to transmitter 106 (block 320). In this embodiment, any further hard bit lane failures may cause a complete link failure. However, other embodiments may tolerate more than single lane failures.

Referring back to block 315, if the error is still present after recreating the data of the designated bit lane, receiver 110 checks whether the resend threshold has been met (block 325). If the resend threshold has not been met, receiver 110 sends a NACK signal to transmitter 106, indicating that the transmission has not been received and to resend that transmission (block 330). Operation proceeds back to block 300, where transmitter 106 resends the transmission and receiver 110 receives it. In addition, receiver 110 determines that a bit lane has been designated as a failing bit lane (block 310). Operation proceeds to block 345 where the failing bit lane data is recreated using the parity information and the data is again checked for errors. This sequence may be repeated. Assuming that the error is still present, the sequence including resend, recreation of the data, error check and error detect may continue for a predetermined number of times until the error disappears or the resend threshold is met (block 325). Once the resend threshold is met, receiver 110 determines whether all bit lanes have been designated as failures during this transmission attempt, (block 335). In this case, all bit lanes have not yet been designated for this transmission.

Accordingly, operation proceeds as described above in block 340 where receiver 110 designates a different bit lane as a failure for all subsequent received transmissions. Again the sequence including resend, recreation of the data, error check and error detect may continue for a predetermined number of times until the error disappears or the resend threshold is met (block 325). As described above, if no error is present, operation continues and the current designated bit lane is designated as failed for all subsequent received transmissions and receiver 110 sends an ACK signal (block 320).

However, if the error continues to be present, the process continues by iteratively designating a new bit lane as failing, recreating the data, and checking for errors. If for a given transmission, receiver 110 determines that all bit lanes have been designated as failed (block 335) and the error persists, receiver 110 may determine that the link has failed. For example, there may be a multiple bit-lane failure or some other catastrophic non-recoverable failure.

It is noted that once a bit lane has been designated as being failed in a previous transmission, and a new transmission (i.e. new sequence number) arrives, receiver 110 determines that a bit lane has already been designated as failed (block 310). Receiver 110 recreates the data of the failed bit lane using the parity (block 345) and then checks the data for errors using the CRC bits (block 315). If no errors are present, receiver continues to designate the failed bit lane as failed and sends an ACK signal to transmitter 106 (block 320). However, if receiver 110 detects an error in the data, receiver 110 may send a NACK signal if the resend threshold has not been met and the sequence including resend, recreation of the data, error check and error detect may continue until either the error disappears or the resend threshold is met (block 325). Once the resend threshold is met, receiver 110 determines that a bit-lane had been designated as a failed bit lane in a previous transmission attempt (block 335) and further that the another bit lane has failed and thus the link has failed (block 360).

Figure 4:
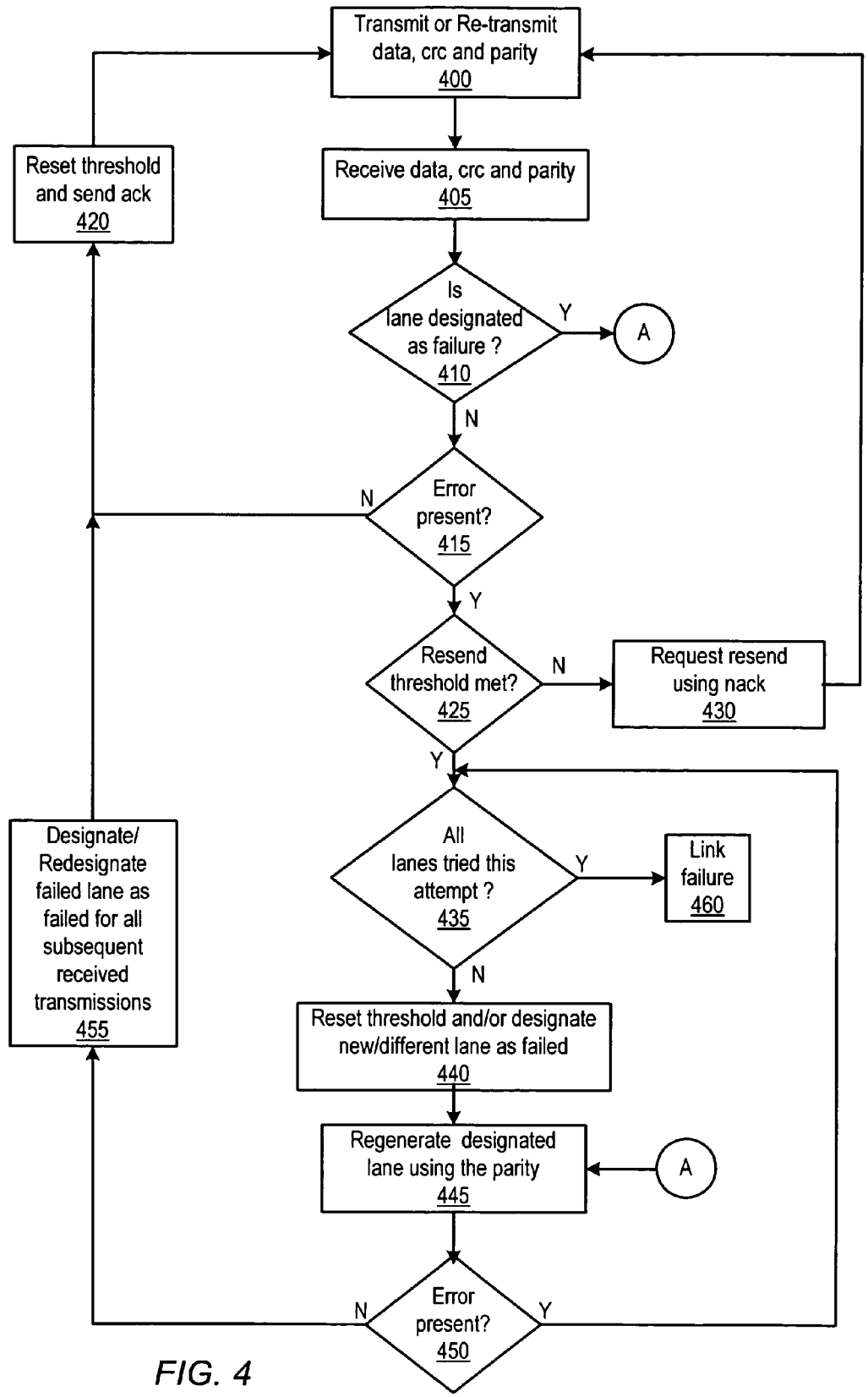
FIG. 4 is a flow diagram describing the operation of another embodiment of an exemplary receiver of the circuits of FIG. 1.

FIG. 4 is a flow diagram describing the operation of an alternative embodiment of the receiver of FIG. 1 and FIG. 2. In such an embodiment, in response to continuing to detect an error after designating a given lane as a failing lane, the receiver may iteratively designate each bit lane as failing and recreate each designated lane and check for errors without sending a NACK signal. For example, the receiver may include buffer circuits (not shown) that may hold the current transmission such that the data may be iteratively recreated using parity and checked using the CRC bits until the failing bit lane is isolated and the error is no longer present.

Referring collectively to FIG. 1-FIG. 2, and FIG. 4, a transmitter such as transmitter 106 transmits data, CRC and parity over a communication link such as unidirectional link 120A, for example. Receiver 110 receives the data, CRC and parity. The operation of the receiver described in FIG. 4 is similar to the operation described above in the description of FIG. 3. For example, blocks 400-420 of FIG. 4 are similar to blocks 300-320 of FIG. 3. However, in FIG. 4, once receiver 110 determines that a hard bit-lane failure is present (i.e., error is not a transient error), receiver 110 may be configured to iteratively designate a new bit lane as having failed, use the parity information to recreate that bit lane, and check the data using the CRC bits without requesting a resend of the data using a NACK.

To illustrate, beginning in block 425, an error has been detected in a transmission and the transmission has been retried a number of times to rule out a transient error. Receiver 110 determines whether all bit lanes have been designated as failures during this transmission attempt (block 435). If all bit lanes have not been designated as a failure during this transmission, the threshold is reset and receiver 110 designates one of the bit lanes as a failure (block 440). Receiver 110 recreates the data of the designated bit lane using the parity information (block 445) and then checks whether an error is present using the CRC bits (block 450).

If there is no error (block 450), similar to the description of FIG. 3, the failing bit lane has been identified. Receiver 110 designates that bit lane as a failed lane for all subsequent received transmissions (block 455), thus the failed bit lane is now isolated. Receiver 110 resets the threshold count and sends an ACK signal to transmitter 106 (block 420).

Referring back to block 450, if the error is still present after recreating the data of the designated bit lane, receiver 110 determines whether all bit lanes have been designated as failures during this transmission attempt (block 435). In this case, all bit lanes have not yet been designated for this transmission. Thus, receiver 110 designates a different bit lane as a failure, the data for the newly designated bit lane is recreated (block 445) and the data is checked for errors (block 450). As described above, if no error is present, operation continues to block 455 where the current designated bit lane is designated as failed for all subsequent received transmissions (block 355) and receiver 110 sends an ACK signal (block 420).

However, if the error continues to be present, the process continues by iteratively designating a new bit lane as failing, recreating the data, and checking for errors until either all lanes have been designated or the error disappears. If for a given transmission, receiver 110 determines that all bit lanes have been designated as failed (block 435) and the error persists, receiver 110 may determine that the link has failed. For example, there may be a multiple bit-lane failure or some other catastrophic non-recoverable failure.

It is noted that in embodiments that employ two logical unidirectional links that share the same physical medium, both receivers may identify and isolate a failing bit lane that occurs substantially simultaneously.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A system comprising:
   a transmitter configured to transmit a segment of data, a cyclic redundancy code, and redundant information via separate bit lanes of a communication link including a plurality of bit lanes; and
   a receiver coupled to the transmitter via the communication link, wherein each bit of the segment of data, and the cyclic redundancy code is conveyed from the transmitter to the receiver serially via a respective single-bit lane of the plurality of bit lanes;
   wherein the segment of data, the redundant information, and the cyclic redundancy code are accumulated within the receiver over a plurality of clock cycles, wherein the cyclic redundancy code covers the segment of data accumulated over the plurality of clock cycles, and wherein the cyclic redundancy code is defined by a serial sequence of the bits of the segment of data conveyed upon each bit lane concatenated with the bits of the segment of data conveyed upon a next bit lane; and
   wherein the receiver is configured to detect an error in the segment of data using the cyclic redundancy code, and in response to detecting the error to regenerate the segment of data using the redundant information, and to determine whether a resulting regenerated bit, along with remaining bits, of the segment of data is correct using the cyclic redundancy code.

2. The system as recited in claim 1, wherein the receiver is further configured to detect an error in the error detecting code using the error detecting code, and in response to detecting the error, to regenerate the error detecting code using the redundant information, and to determine whether a resulting regenerated error detecting code is correct using the error detecting code.

3. The system as recited in claim 2, wherein the receiver is further configured to regenerate a different bit of the segment of data using the redundant information in response to determining that the resulting regenerated bit, along with remaining bits, of the segment of data are not correct.

4. The system as recited in claim 1, wherein the error detecting code is an error correcting code.

5. The system as recited in claim 1, wherein the redundant information is conveyed from the transmitter to the receiver serially via a single bit lane and includes parity information corresponding to bits of the segment of data and the error detecting code conveyed in a given clock cycle.

6. The system as recited in claim 1, wherein in response to determining that the resulting regenerated bit, along with remaining bits, of the segment of data are correct, the receiver is further configured to regenerate bits of the segment of data conveyed on a same bit lane using the redundant information when receiving subsequent transmissions.

7. The system as recited in claim 1, wherein in response to detecting the error, the receiver is configured to request the transmitter resend the segment of data, the error detecting code, and the redundant information a predetermined number of times prior to regenerating the segment of data using the redundant information.

8. A method comprising:
transmitting a segment of data, a cyclic redundancy code, and redundant information; and
conveying the segment of data, the cyclic redundancy code, and the redundant information via separate bit lanes of a communication link including a plurality of bit lanes, wherein each bit of the segment of data, and the cyclic redundancy code is conveyed from the transmitter to the receiver serially via a respective single-bit lane;
accumulating the segment of data, the redundant information, and the cyclic redundancy code within the receiver over a plurality of clock cycles;
wherein the cyclic redundancy code covers the segment of data accumulated over the plurality of clock cycles, and wherein the cyclic redundancy code is defined by a serial sequence of the bits of the segment of data conveyed upon each bit lane concatenated with the bits of the segment of data conveyed upon a next bit lane;
detecting an error in the segment of data using the cyclic redundancy code, and in response to detecting the error, regenerating the segment of data using the redundant information; and
determining whether a resulting regenerated bit, along with remaining bits, of the segment of data is correct using the cyclic redundancy code.

9. The method as recited in claim 8, further comprising detecting an error in the error detecting code using the error detecting code, and in response to detecting the error, regenerating the error detecting code using the redundant information, and determining whether a resulting regenerated error detecting code is correct using the error detecting code.

10. The method as recited in claim 9, further comprising regenerating a different bit of the segment of data using the redundant information in response to determining that the resulting regenerated bit, along with remaining bits, of the segment of data are not correct.

11. The method as recited in claim 8, wherein the error detecting code is an error correcting code.

12. The method as recited in claim 8, wherein the redundant information includes parity information corresponding to bits of the segment of data and the error detecting code conveyed in a given clock cycle.

13. The method as recited in claim 8, in response to determining that the resulting regenerated bit, along with remaining bits, of the segment of data are correct, regenerating bits of the segment of data conveyed on a same bit lane using the redundant information when receiving subsequent transmissions.

14. The method as recited in claim 8, further comprising in response to detecting the error, requesting the transmitter resend the segment of data, the error detecting code, and the redundant information a predetermined number of times prior to regenerating the segment of data using the redundant information.

15. A system comprising:
means for transmitting a segment of data, a cyclic redundancy code, and redundant information; and
means for conveying the segment of data, the cyclic redundancy code, and the redundant information via separate bit lanes of a communication link including a plurality of bit lanes, wherein each bit of the segment of data, and the cyclic redundancy code is conveyed from the transmitter to the receiver serially via a respective single-bit lane;
means for accumulating the segment of data, the redundant information, and the cyclic redundancy code within the receiver over a plurality of clock cycles, wherein the cyclic redundancy code covers the segment of data accumulated over the plurality of clock cycles, and wherein the cyclic redundancy code is defined by a serial sequence of the bits of the segment of data conveyed upon each bit lane concatenated with the bits of the segment of data conveyed upon a next bit lane;
means for detecting an error in the segment of data using the cyclic redundancy code, and in response to detecting the error, regenerating the segment of data using the redundant information; and
means for determining whether a resulting regenerated bit, along with remaining bits, of the segment of data is correct using the cyclic redundancy code.

16. A system comprising:
a transmitter configured to transmit, via separate bit lanes of a communication link including a plurality of bit lanes, a segment of data, a cyclic redundancy code, and redundant information;
wherein the cyclic redundancy code covers the segment of data accumulated over the plurality of clock cycles, and wherein the cyclic redundancy code is defined by a serial sequence of the bits of the segment of data conveyed upon each bit lane concatenated with the bits of the segment of data conveyed upon a next bit lane; and
a receiver coupled to the transmitter via the communication link, wherein the receiver is configured to detect an error in the segment of data using the cyclic redundancy code, and in response to detecting the error, for each bit of the segment of data, to iteratively regenerate at least one bit of the segment of data using the redundant information;
wherein the receiver is further configured to determine whether the resulting regenerated bit, along with the remaining bits, of the segment of data are correct using the cyclic redundancy code.

* * * * *